United States Patent
Oh

(10) Patent No.: US 9,459,302 B2
(45) Date of Patent: Oct. 4, 2016

(54) DEVICE UNDER TEST TESTER USING REDRIVER

(71) Applicant: UNITEST INC, Yongin-si, Gyeonggi-do (KR)

(72) Inventor: Jin An Oh, Goyang-si (KR)

(73) Assignee: UNITEST INC, Yongin-si, Gyeonggi-do (KR)

( * ) Notice: Subject to any disclaimer, the term of this patent is extended or adjusted under 35 U.S.C. 154(b) by 59 days.

(21) Appl. No.: 13/921,996

(22) Filed: Jun. 19, 2013

(65) Prior Publication Data

US 2014/0049265 A1 Feb. 20, 2014

(30) Foreign Application Priority Data

Aug. 16, 2012 (KR) ........................ 10-2012-0089382

(51) Int. Cl.
*G01R 31/00* (2006.01)
*G01R 31/319* (2006.01)

(52) U.S. Cl.
CPC ....... *G01R 31/003* (2013.01); *G01R 31/31905* (2013.01)

(58) Field of Classification Search
CPC .............. G01R 31/00; G01R 31/003; G01R 31/31905; G01R 31/31901; G01R 31/002; G01R 31/0626; G01R 31/0658; G01R 1/16; G01R 3/0679; G01R 31/26; H01L 24/49; H01L 21/66
USPC ...................................................... 324/555
See application file for complete search history.

(56) References Cited

U.S. PATENT DOCUMENTS

| | | | |
|---|---|---|---|
| 2008/0024143 A1* | 1/2008 | Miller et al. ................... | 324/555 |
| 2008/0046228 A1* | 2/2008 | Cha et al. ........................ | 703/28 |
| 2009/0013372 A1* | 1/2009 | Oakes et al. ................... | 725/139 |
| 2009/0289636 A1* | 11/2009 | Hernandez ..................... | 324/555 |
| 2010/0079151 A1* | 4/2010 | Nordstrom et al. ........... | 324/555 |
| 2010/0118482 A1* | 5/2010 | Kim ....................... | G06F 3/0626 |
| | | | 361/679.32 |
| 2011/0238345 A1* | 9/2011 | Gauthier et al. ................ | 702/64 |
| 2011/0243211 A1* | 10/2011 | Chacko et al. ............... | 375/228 |

FOREIGN PATENT DOCUMENTS

| | | | | |
|---|---|---|---|---|
| KR | 10-0916209 | * | 9/2009 | ............ G01R 31/26 |
| KR | 10-0916209 B1 | | 9/2009 | |

* cited by examiner

*Primary Examiner* — Arleen M Vazquez
*Assistant Examiner* — Brent J Andrews
(74) *Attorney, Agent, or Firm* — Novick, Kim & Lee, PLLC; Jae Youn Kim

(57) ABSTRACT

Disclosed is a device under test (DUT) tester using a redriver. The DUT tester more effectively tests the DUT, which is a predetermined semiconductor device, by applying an electrical signal to the DUT and measuring the electrical signal. The DUT tester includes a DUT test unit, a printed circuit board (PCB) provided therein with connectors for the connection with the DUT test unit, one DUT or more horizontally arranged on the PCB, and redrivers horizontally provided under the PCB and one-to-one matched with one DUT or more to compensate for the distortion of the signal integrity of test signals caused according to the variation of the transmission distance.

5 Claims, 8 Drawing Sheets

PRIOR ART

PRIOR ART

PRIOR ART

PRIOR ART

PRIOR ART

DEVICE UNDER TEST TESTER USING REDRIVER

BACKGROUND OF THE INVENTION

1. Field of the Invention

The present invention relates to a device under test (DUT) tester using a redriver, capable of more effectively testing the DUT, which is a predetermined semiconductor device, by applying an electrical signal to the DUT and measuring the electrical signal. In more particular, the present invention relates to a device under test (DUT) tester by using a redriver, which includes a DUT test unit, a printed circuit board (PCB) provided therein with connectors for the connection with the DUT test unit, one DUT or more horizontally arranged on the PCB, and redrivers horizontally provided under the PCB and one-to-one matched with one or more DUT to compensate for the distortion of the signal integrity of test signals caused according to the variation of the transmission distance.

2. Description of the Related Art

In order to properly ensure the functionality and the reliability of semiconductor devices, the manufacturers of the semiconductor devices test the semiconductor devices before delivering the semiconductor devices to venders or customers.

In general, the failure probability of a device under test (DUT) is most highly represented during a predetermined time in the initial stage, and, thereafter, almost uniformly represented until the life span of the DUT is terminated.

The DUT is tested under an environment severer than a general use environment (e.g., room temperature) of the DUT, such that the failure of the DUT that may be found under the general use environment of the DUT can be more rapidly detected. Accordingly, the potential failure of the DUT, which may be found after DUTs have been come onto the market, can be detected.

Hereinafter, a DUT tester according to the related art will be described with reference to FIGS. 1 to 4.

FIG. 1 is a view showing the structure of the DUT tester according to the related art having a printed circuit board (PCB) equipped with test sockets vertically arranged thereon. In an initial DUT tester, a circular PCB is prepared to test DUTs one by one. Thereafter, for the purpose of test convenience, a plurality of DUTs are vertically stacked on each other and tested in a test chamber.

As shown in FIG. 1, the initial DUT tester has a wall vertically installed therein. A test unit (mainly a unit such as a PC provided therein with a microprocessor or a controller) is installed in one space of a wall. An opposite space of the wall is used as a chamber, and provided therein with test sockets in such a manner that the DUTs are installed in the test sockets. In addition, since the DUT test unit is linked with each DUT through a cable, as the number of DUTs to be tested is increased, the number of cables must be increased corresponding to the number of the DUTs.

Accordingly, the DUT tester shown in FIG. 1 has a limitation in increasing the number of DUTs since the DUTs are installed on a vertical surface. In addition, there is a limitation in automating the installation or the uninstallation of the DUTs.

Therefore, in order to solve the problem related to the DUT tester of FIG. 1, increase the number of DUTs to be tested, and facilitate the installation of the DUTs on the PCB or the uninstallation of the DUTs from the PCB, Korean Patent Registration No. 10-0916209 (issued on Sep. 1, 2009) discloses a test system for a DUT in which DUTs are horizontally installed.

In a DUT tester of FIG. 2, since a PCB having a DUT installed therein may be easily introduced or withdrawn in a horizontal direction, the DUT may be easily installed or uninstalled.

In addition, since cables connecting a vertically installed DUT test unit with DUTs are installed in the PCB (not shown), the cables may not be exposed to the outside.

Further, in the DUT tester of FIG. 2, DUTs are installed on the PCB, and controllers or test units matched with the DUTs are installed under the PCB. Since each controller is electrically connected to the DUT, a connection characteristic is improved, and a test processing rate is increased corresponding to 1.5 Gbps which is the transfer rate of an interface.

However, the DUT can be tested in FIG. 1 even if only one controller is installed outside the chamber, but controllers must be installed by the number of the DUTs in FIG. 2.

In particular, since the controller or the test unit used in the DUT tester is expensive and represents weak heat resistance, the failure probability of the controller may be increased when testing the DUT.

As shown in FIG. 3, in order to solve the problem related to the DUT tester of FIG. 2, controllers or test units one-to-one matched with each DUT are provided outside the chamber, and each test unit is linked with each DUT through the inner cable of the PCB.

Accordingly, even if only one controller or test unit, which is expensive and represents weak heat resistance, is provided, the DUT can be tested.

However, even if the inner cable of the PCB is used in FIGS. 2 and 3, the number of inner cables is required by the number of DUTs. In addition, fine cables may cause severe degradation to the signal integrity of test signals due to the high-temperature heat in the test chamber.

Particularly, although the DUT tester shown in FIGS. 2 and 3 according to the related art can easily test DUTs at a conventional transfer rate of 1.5 Gbps of an interface for transferring test signals, as the interface transfer rate is increased to two times or four times the transfer rate, that is, 3 Gbps or 6 Gbps, the signal integrity of the test signal is degraded according to the variation of the transmission distance while the test signal passes through the PCB. Accordingly, even if the interface represents the high transfer rate, it is impossible to exactly test DUTs at a test speed suitable for the interface.

In other words, the DUT tester according to the related art significantly degrades the signal integrity of a test signal according to the variation of the transmission distance regardless of whether controllers are one-to-one matched with DUTs as shown in FIG. 2, or whether the controllers or test units are provided outside the chamber as shown in FIG. 3.

FIG. 4 is a view showing the degradation of the signal integrity in the case that DUTs are horizontally arranged on a test printed circuit board according to the related art.

Since a DUT 1 of FIG. 4 is located close to the interface or a test unit, the transmission distance of the test signal is short. Accordingly, the test signal is transferred to the interface or the test unit without the signal distortion.

However, since the distance between a DUT 2 of FIG. 4 and the interface or the test unit is longer than the distance between the DUT 1 of FIG. 4 and the interface or the test unit, the transmission distance of the test signal is increased. Therefore, test signals are transferred to the interface or the test unit in the state that the test signals are significantly distorted. Since the degradation of the signal integrity according to the transmission distance is more increased as the transfer rate is increased, the desirable signal integrity may not be obtained corresponding to the transfer rate.

CITED REFERENCE

Patent Document 1: Korean Patent Registration No. 10-0916209 (issued on Sep. 1, 2009)

SUMMARY OF THE INVENTION

Accordingly, the present invention has been made keeping in mind the above problems occurring in the prior art, and an object of the present invention is to provide a DUT tester using a redriver, capable of receiving test signals having the same signal integrity from all device under tests (DUTs) by compensating for signal difference according to the variation of the transmission distance through the connection with the redrivers having one-to-one matching relation with DUTs to be tested in order to prevent the signal integrity from being degraded according to the variation of the transmission distance when the test signal passes through a printed circuit board (PCB).

Another object of the present invention is to provide a DUT tester using a redriver having a dedicated IP address in order to remove signal distortion caused by heat of the chamber in DUT test by reducing cables installed in each PCB corresponding to the number of DUTs to one cable.

Still another object of the present invention is to provide a DUT tester using a redriver, in which a plurality of PCBs are vertically stacked on each other in a chamber, and DUT test units are installed outside the chamber in such a manner that the DUT test units are one-to-one matched with the PCBs, thereby increasing the number of DUTs to be tested.

To accomplish these objects, according to one aspect of the present invention, there is provided a device under test (DUT) tester using a redriver. The DUT tester includes a device under test (DUT) test unit, a printed circuit board having a connector for connection with the device under test (DUT) test unit, at least one device under test (DUT) horizontally arranged on the printed circuit board, and redrivers horizontally arranged under the printed circuit board, and connected to the at least one device under test (DUT) in one-to-one matching relation with the at least one device under test (DUT) to compensate for distortion of signal integrity caused according to the variation of the transmission distance of a test signal.

In addition, each redriver has a dedicated IP address.

Further, the device under test (DUT) test unit connected with the printed circuit board through the connector is located outside a chamber in which the device under test (DUT) is tested.

A plurality of printed circuit boards and a plurality of device under test (DUT) test units are vertically stacked on each other.

According to the DUT test unit using the redriver of an exemplary embodiment of the present invention, the at least one device under test (DUT) to be tested is an SSD based on a flash memory or an SSD based on a DRAM.

The test unit and the connector use one of a serial-ATA (SATA) interface, a serial attached SCSI (SAS) interface, and a PCI express (PCIe) interface.

According to the exemplary embodiment of the present invention, each redriver used in the DUT test unit is connected to the connector through one cable.

As described above, in order to compensate for the degradation of the signal integrity according to the variation of the transmission distance, the signal difference according to the variation of the transmission distance can be compensated by employing redrivers for their respective DUTs. Accordingly, the test signals having the same signal integrity are applied to all DUTs, so that the DUTs can be uniformly performed.

In addition, according to the present invention, since redrivers having dedicated IP addresses are used, cables installed in each PCB can be reduced to one.

Further, according to the present invention, a plurality of PCBs are vertically installed in the chamber, and DUT test units one-to-one matched with the PCBs are installed outside the chamber, so that the number of DUTs tested at one time can be increased.

BRIEF DESCRIPTION OF THE DRAWINGS

The above and other objects, features and other advantages of the present invention will be more clearly understood from the following detailed description when taken in conjunction with the accompanying drawings, in which.

DETAILED DESCRIPTION OF THE INVENTION

Although a device under test (DUT) used for the test according to the present invention may include a predetermined type of a semiconductor device such as an SSD, an HDD, or a DRAM, the DUT includes an SSD based on a flash memory device or an SSD based on a DRAM according to an exemplary embodiment of the present invention.

A solid state drive is a device to store information by using a semiconductor, which is called "semiconductor drive" or "SSD".

Since the SSD completely electronically operates, the SSD may significantly reduce long seek time, long response time, long mechanical latency, and a failure rate which are caused in a hard disc drive (HDD) electromechanically operating.

In particular, most SSDs based on the flash memory represent a read/write speed lower than that of the HDD when data are continuously read or written except for the data access time. However, recently, SSDs having the read/write speed superior to that of the HDD have been introduced.

Most SSD manufacturers manufacture small devices for general consumers by using non-volatile flash memories. The SSD based on such a flash memory is called "flash drive", and does not require a battery. In addition, since the SSD represents the non-volatile property, the SSD can continuously retain storage information even in the state that the flash SSD is powered off, so that the SSD can ensure data permanent. The SSD based on the flash memory represents the speed lower than the speed of the SSD based on the DRAM. Especially, some models of the SSD based on the flash memory represent the speed lower than the typical HDD when processing large files. However, since the SDD based on the flash memory has no moving components, the seek time that may be found in a typical electromechanical disk and other latencies may be negligible.

An SSD based on a volatile memory such as a DRAM represents a very rapid data access speed. The SSD based on the DRAM generally ensures data permanent by using an internal battery, an external AC/DC adaptor, and a back-up storage system. However, power is not supplied to the SSD from external resources. If the power is lost, the battery supplies power while all pieces of information are copied into a back-up storage device from a RAM. If the power is recovered, the information is copied into the RAM from the back-up storage device, so that the SSD performs general functions (this is similar to the maximum power saving mode provided to modern operating systems)

Figure 1:
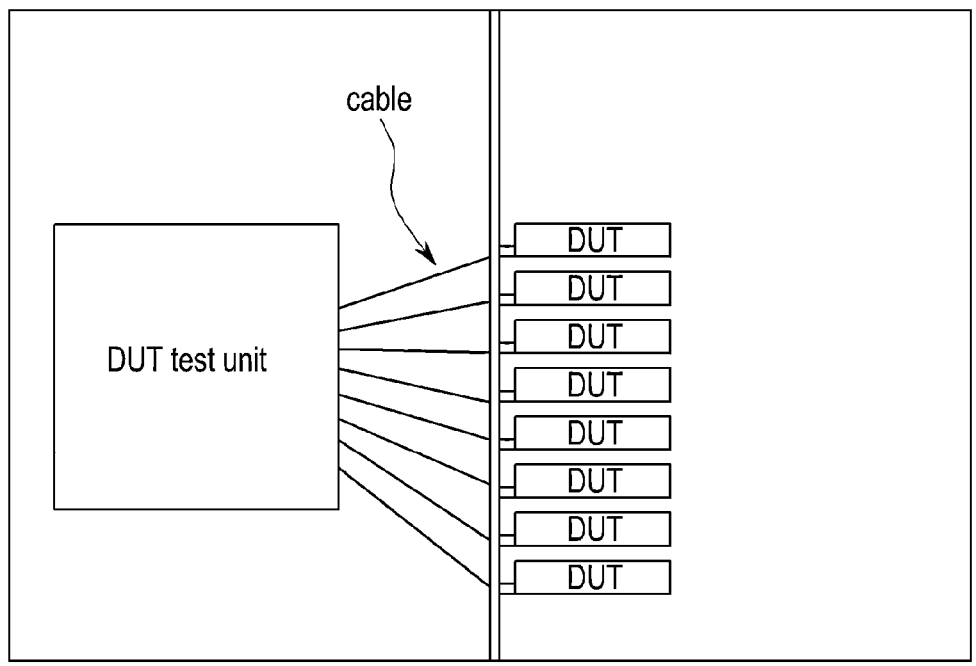
FIG. 1 is a view showing the structure of a DUT tester according to the related art having a test printed circuit board (PCB) equipped with test sockets vertically arranged thereon.
Figure 2:
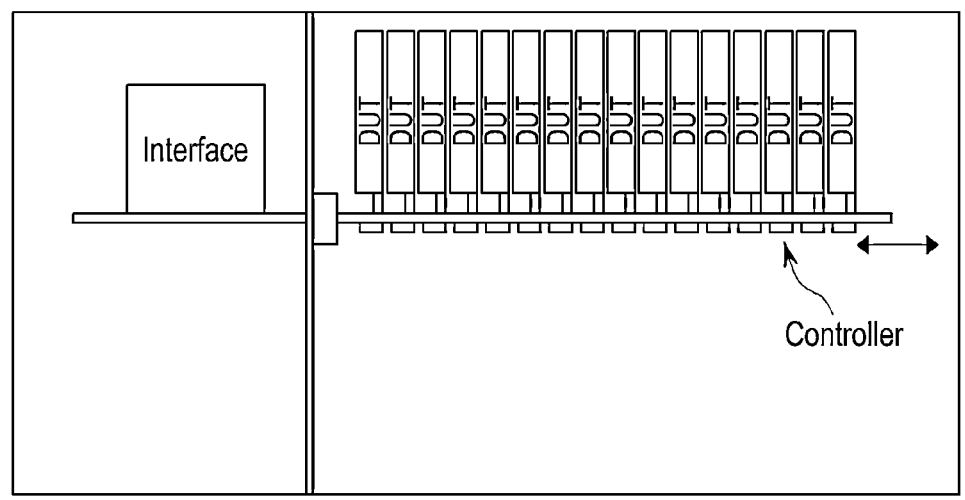
FIG. 2 is a view showing the structure of a DUT tester according to the related art having controllers corresponding to DUTs horizontally arranged under the test PCB.
Figure 3:
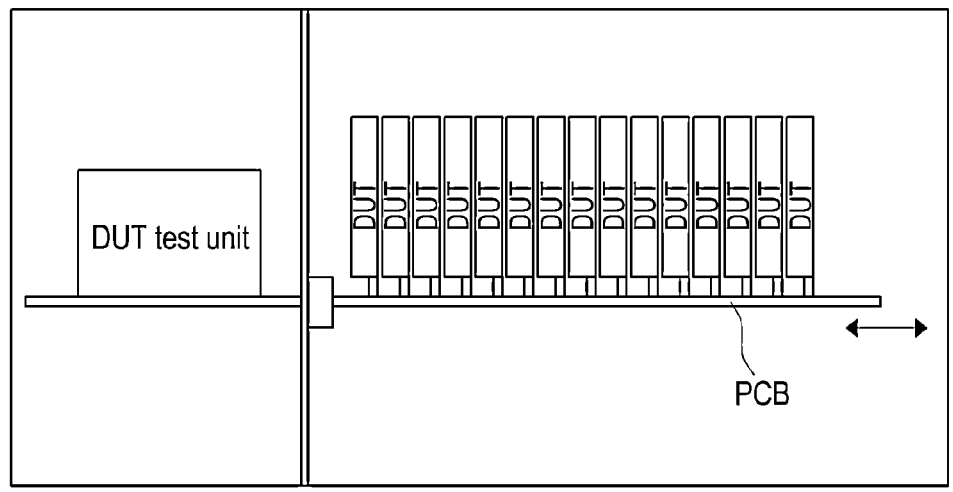
FIG. 3 is a view showing the structure of the DUT tester according to the related art having DUTs horizontally arranged in the test PCB.
Figure 4:
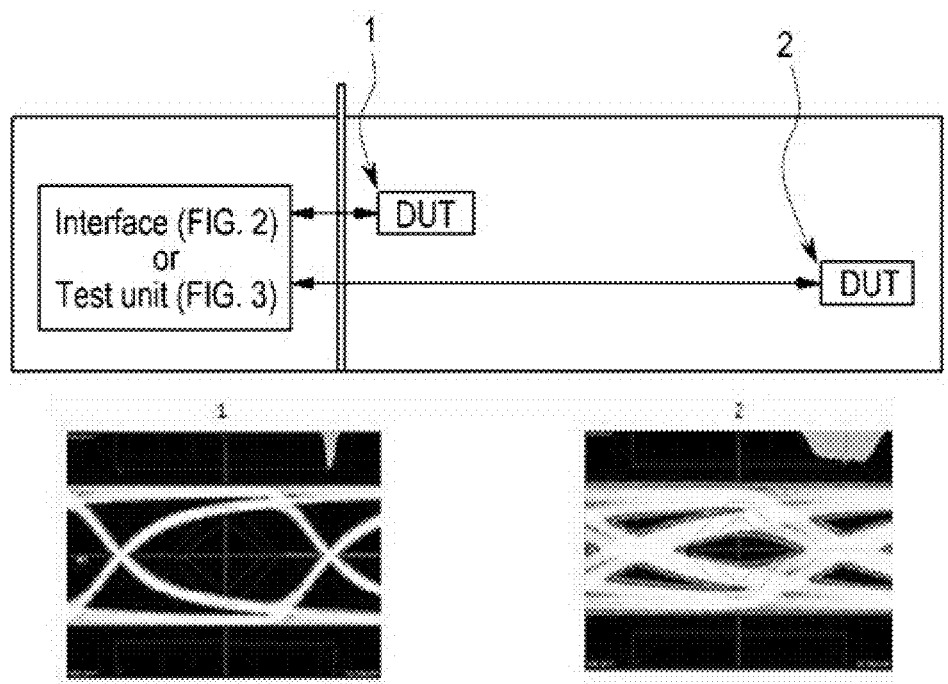
FIG. 4 is a view showing the degradation of the signal integrity of a test signal in the case that DUTs are horizontally arranged on the test PCB according to the related art.
Figure 5:
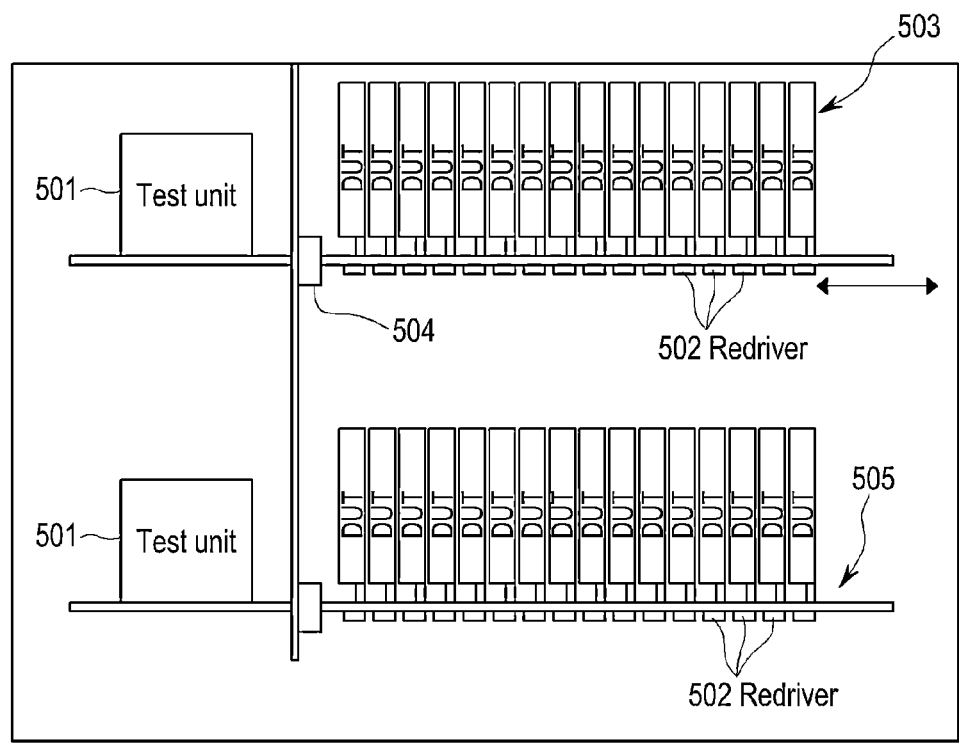
FIG. 5 is a view showing the structure of a DUT tester using a redriver according to the present invention.

FIG. 5 is a view showing the structure of a DUT tester using a redriver.

As shown in FIG. 5, the DUT tester using the redriver according to the present invention includes a printed circuit board (PCB) 505 equipped with a connector 504 for the connection with a DUT test unit 501, one DUT or more 503 horizontally arranged above the PCB 505, and redrivers 502 horizontally provided below the PCB 505 and one-to-one matched with one DUT or more 503 to compensate for the distortion of the signal integrity of the test signal according to the variation of transmission distance.

The DUT test unit according to the present invention includes a controller to transfer a test signal to each DUT, or to control a test signal which has been transmitted from the DUT through the redriver.

The connector may be provided for the purpose of the connection with the DUT test unit, and may be configured in the form of connection pins. Since the PCB is horizontally installed, the PCB having DUTs installed thereon can be easily introduced or withdrawn.

In addition, since the test unit according to the present invention is provided outside a chamber having the PCB therein, the test unit can protect the controller weak against the internal heat of the chamber.

The redriver according to the present invention compensates for the degradation of the signal integrity caused by the variation of the signal transmission distance from the DUT test unit. Redrivers are applied to DUTs one by one so that the signal difference according to the variation of the transmission distance can be compensated.

Figure 7:
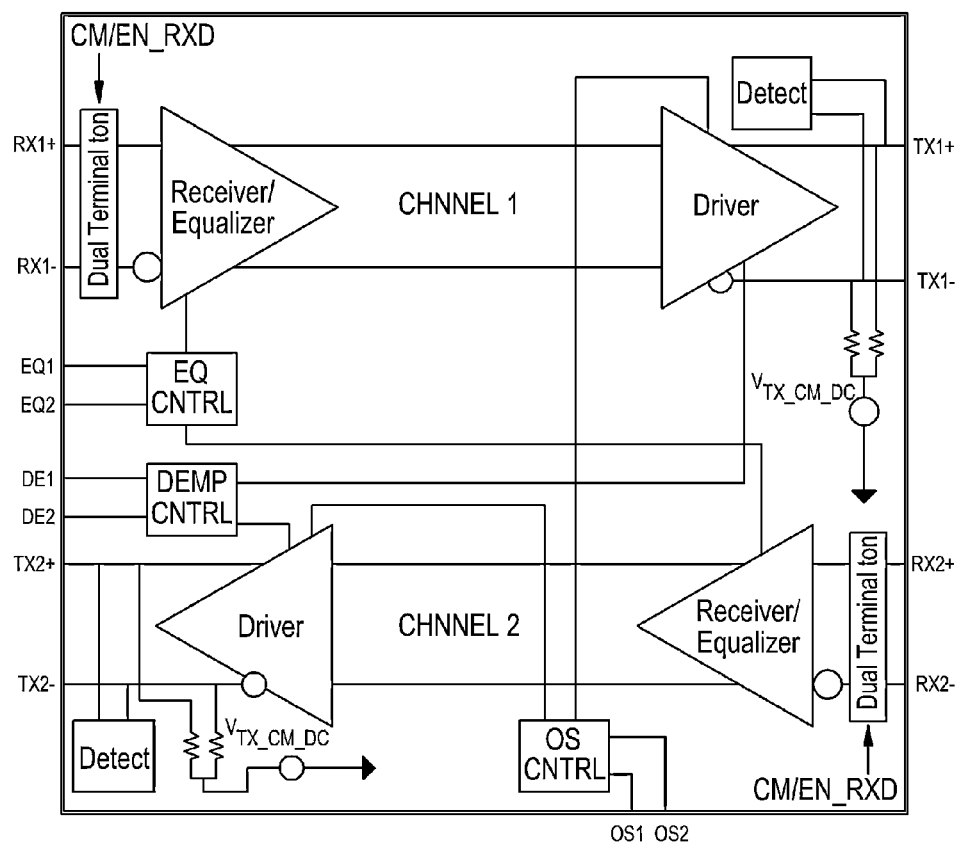
FIG. 7 is a circuit diagram showing a redriver (device No. SN65LVPE502) which has been introduced into the market by Texas Instrument (TI)

FIG. 7 is a redriver (device No. SN65LVPE502) which has been introduced into the market by Texas Instrument (TI). Recently, many redrivers to improve signal integrity have been used. It is generally known in the art that the redrivers exactly compensate for the signal integrity with respect to the transmission distances of 3m or more.

In addition, it is obvious to those skilled in the art that various types of redrivers to compensate for the signal difference according to the variation of the transmission distance may be used.

Figure 6:
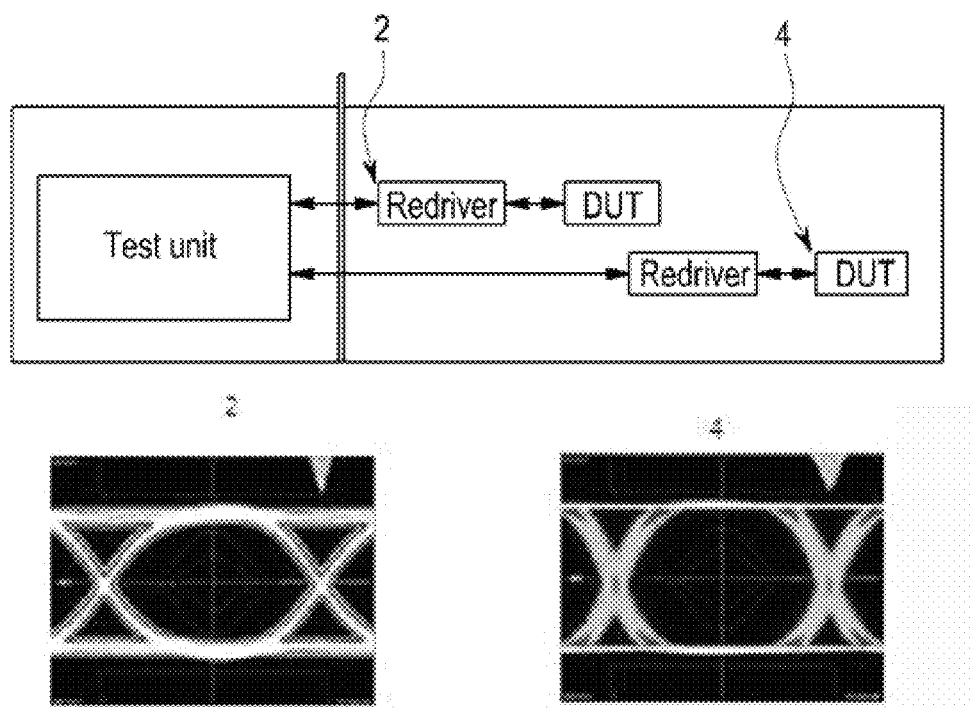
FIG. 6 is a view showing the signal integrity of the DUT tester using the redriver according to the present invention.

FIG. 6 is a view showing the signal integrity of the DUT tester using the redriver according to the present invention. According to the present invention, since the test signal of the DUT is compensated by using the redriver, the signal integrity can be prevented from being degraded according to the variation of the transmission distance.

In FIG. 6, the signal integrity of the test signal of the DUT compensated through a redriver 2 hardly differs from the signal integrity of the test signal of the DUT compensated through a redriver 4.

As described above, according to the DUT tester using the rederiver of the present invention, the signal integrity is prevented from being degraded due to the variation of the transmission distance, so that the test signal having the same signal integrity can be maintained.

In addition, each redriver according to the present invention has a dedicated IP address, and data related to the compensation degree of a signal according to the variation of a transmission distance are previously stored in the test unit.

Therefore, since the test unit can recognize the signal integrity of signals transmitted from redrivers according to IP addresses of the redrivers, when the signal transmitted from the redriver having a specific IP address is regarded as a failed signal, the test unit can find the failure of the DUT one-to-one matched with the redriver corresponding to the IP address.

In addition, since redrivers have dedicated IP addresses, a plurality of DUT test signals may be transmitted even though the number of cables required by the number of DUTs according to the related art is reduced to one. Further, since the test results can be obtained through IP addresses, only one cable may be installed in the PCB instead without installing many cables in the PCB. Further, since a thick cable may be installed in the PCB, the cable can transmit a signal with stronger heat resistance against the heat of the chamber.

In addition, according to the DUT tester using the redrivers of the exemplary embodiment of the present invention, since a plurality of PCBs and a plurality of DUTs are one-to-one matched with each other while being vertically stacked on each other, the number of the DUTs to be tested can be increased to two times greater than the number of DUTs according to the related art. Naturally, those skilled in the art can comprehend that PCBs and test units can be stacked on each other in a multi-layer structure.

Further, the test unit of the DUT tester using the redriver according to the present invention and a connector employ one of an SATA interface, an SAS interface, and a PCIe interface. The SATA interface or the serial ATA is made to increase a data rate. Since the SAS interface employs a serial SCSI scheme in which data are transmitted through a single passage, the SAS represents a transmission effect faster than that of an existing parallel SCSI. The PCIe interface is an input/output serial interface made by the PCI SIG in 2002.

Figure 8:
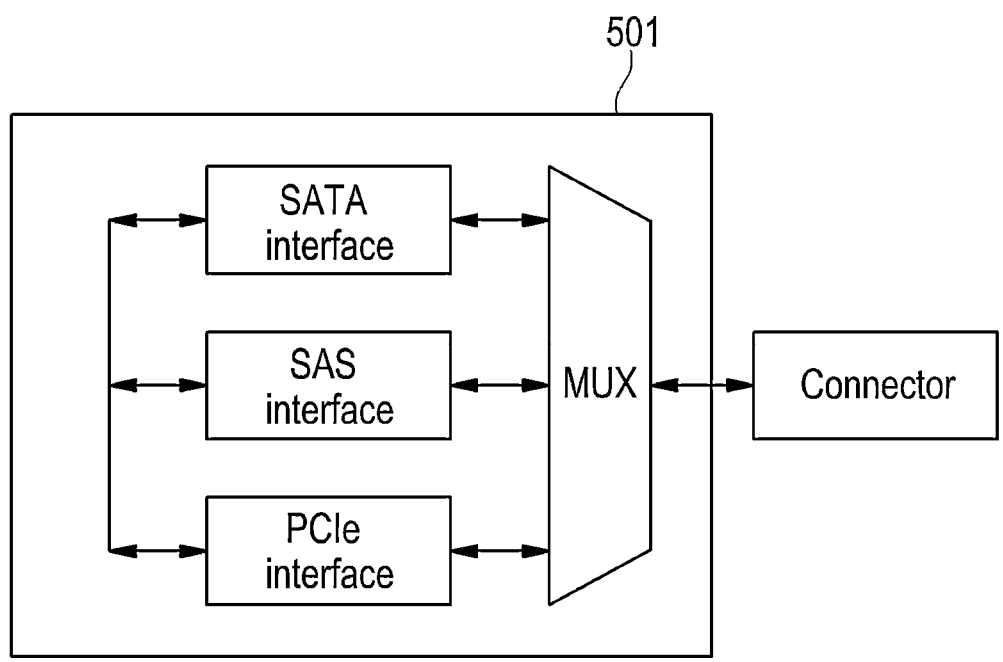
FIG. 8 is a view showing the interfaces of the DUT tester using the redriver according to the present invention.

FIG. 8 is a view showing an interface structure of the DUT tester according to the exemplary embodiment of the present invention, in which each of SATA, SAS, and PCIe interfaces may be individually used, or all interfaces may be used by using a multiplexer (MUX).

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A device under test (DUT) tester using a redriver, the device under test (DUT) tester comprising:
    a device under test (DUT) test unit;
    a printed circuit board (PCB) having a connector for connection with the device under test (DUT) test unit;
    at least one device under test (DUT) horizontally arranged on the printed circuit board; and
    redrivers horizontally arranged under the printed circuit board, and connected to the at least one device under test (DUT) in one-to-one matching relation with the at least one device under test (DUT) to compensate for a distortion of signal integrity caused according to a variation of a transmission distance of a test signal,
    wherein each redriver has a dedicated IP address,
    wherein a plurality of printed circuit boards and a plurality of device under test (DUT) test units are vertically stacked on each other while forming one-to-one matching relation with each other, and
    wherein the device under test (DUT) test unit includes a multiplexer configured to select one of a serial-ATA (SATA) interface, a serial attached SCSI (SAS) interface, and a PCI express (PCIe) interface to connect the test unit with the at least one device under test (DUT) and each redriver.

2. The device under test (DUT) tester of claim 1, wherein the device under test (DUT) test unit connected with the printed circuit board (PCB) through the connector is located outside a chamber in which the device under test (DUT) is tested.

3. The device under test (DUT) tester of claim 1, wherein the at least one device under test (DUT) is a SSD based on a flash memory or a SSD based on a DRAM.

4. The device under test (DUT) tester of claim 1, wherein the device under test (DUT) test unit includes a controller to control the device under test (DUT).

5. The device under test (DUT) tester of claim 4, wherein each redriver is connected to the connector through one cable.

* * * * *